(12) United States Patent
Wahl et al.

(10) Patent No.: US 8,460,984 B2
(45) Date of Patent: Jun. 11, 2013

(54) FIN-FET DEVICE AND METHOD AND INTEGRATED CIRCUITS USING SUCH

(75) Inventors: Jeremy Wahl, Delmar, NY (US); Kingsuk Maitra, Guilderland, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 13/156,578

(22) Filed: Jun. 9, 2011

(65) Prior Publication Data

US 2012/0313169 A1 Dec. 13, 2012

(51) Int. Cl.
*H01L 21/84* (2006.01)
(52) U.S. Cl.
USPC ........... 438/164; 438/412; 257/353; 257/623; 257/E21.377
(58) Field of Classification Search
USPC .. 257/327, 353, 354, 623, E21.377; 438/164, 438/412, 978
See application file for complete search history.

(56) References Cited

U.S. PATENT DOCUMENTS

| | | | |
|---|---|---|---|
| 6,413,802 B1 | 7/2002 | Hu et al. | |
| 6,642,090 B1 * | 11/2003 | Fried et al. | 438/164 |
| 6,720,619 B1 | 4/2004 | Chen et al. | |
| 7,074,656 B2 | 7/2006 | Yeo et al. | |
| 7,105,894 B2 | 9/2006 | Yeo et al. | |
| 7,122,412 B2 | 10/2006 | Chen et al. | |
| 7,176,092 B2 | 2/2007 | Yeo et al. | |
| 7,214,991 B2 | 5/2007 | Yeo et al. | |
| 7,244,640 B2 | 7/2007 | Yang et al. | |
| 7,262,086 B2 | 8/2007 | Yeo et al. | |
| 7,354,830 B2 | 4/2008 | Lin et al. | |
| 7,459,756 B2 | 12/2008 | Lin et al. | |
| 7,635,632 B2 | 12/2009 | Yeo et al. | |
| 7,638,843 B2 * | 12/2009 | Xiong et al. | 257/347 |
| 7,701,008 B2 | 4/2010 | Yeo et al. | |
| 7,719,059 B2 * | 5/2010 | Hofmann et al. | 257/351 |
| 7,851,276 B2 * | 12/2010 | Yang et al. | 438/149 |
| 7,863,674 B2 | 1/2011 | Yeo et al. | |
| 7,888,201 B2 | 2/2011 | Yeo et al. | |
| 2007/0161171 A1 * | 7/2007 | Burnett et al. | 438/197 |

\* cited by examiner

*Primary Examiner* — Eduardo A Rodela
(74) *Attorney, Agent, or Firm* — Ingrassia Fisher & Lorenz, P.C.

(57) ABSTRACT

FIN-FET ICs with adjustable FIN-FET channel widths are formed from a semiconductor layer (42). Fins (36) may be etched from the layer (42) and then some (46) locally shortened or the layer (42) may be locally thinned and then fins (46) of different fin heights etched therefrom. Either way provides fins (46) and FIN-FETs (40) with different channel widths W on the same substrate (24). Fin heights (H) are preferably shortened by implanting selected ions (A, B, C, etc.) through a mask (90, 90', 94, 94', 97, 97') to locally enhance the etch rate of the layer (42) or some of the fins (36). The implant(s) (A, B, C, etc.) is desirably annealed and then differentially etched. This thins part(s) (42-*i*) of the layer (42) from which the fins (46) are then etched or shortens some of the fins (46) already etched from the layer (42). For silicon, germanium is a suitable implant ion. Having fins (42) with adjustable fin heights Hi on the same substrate (24) enables such FIN-FET ICs (40) to avoid channel-width quantization effects observed with prior art uniform fin height FIN-FETs (20).

17 Claims, 10 Drawing Sheets

FIN-FET DEVICE AND METHOD AND INTEGRATED CIRCUITS USING SUCH

FIELD OF THE INVENTION

This invention relates generally to structures and methods for forming fins for fin-type field effect transistors (FIN-FETs), the FIN-FETs using such fins and integrated circuits (ICs) incorporating such FIN-FETs.

BACKGROUND OF THE INVENTION

It is known that high performance field effect transistors (FETs) can be formed in fin-like semiconductor structures, commonly referred to as "FIN-FETs". Integrated circuits (ICs) are fabricated using such FIN-FETS. Unlike conventional planar FETs, with FIN-FETs the semiconductor region containing the source-drain channel has a fin-like shape standing approximately perpendicular to the plane of the substrate die or wafer on which the device is formed. Gate electrodes can be provided on both exposed sides of the fin-like channel region and sometimes along the narrow top edge and even along the narrow bottom edge, although such edge gates are not required. The term "tri-gate" is used to refer to fin-type FETs that have the gate along the narrow top edge as well as along the sides. As used herein, the term "FIN-FET", singular or plural, is intended to include all such variations.

The channel width W of a FIN-FET is primarily determined by the height H of the fin above the supporting substrate multiplied by the number of fins electrically connected in parallel in the FIN-FET. For a single tri-gate FIN-FET, W=2*H+fin thickness, and for a single non-trigate FIN-FET, W=2*H. The channel length L is substantially determined by the distance along the length of the fin(s), usually substantially parallel to the supporting substrate, between the source and drain where the opposing sides of the fin are covered by the gate electrode. Because of the distinctly different geometry of a FIN-FET compared to a planar FET, designing and constructing a FIN-FET and ICs embodying FIN-FETs to meet specific performance criteria present special challenges.

BRIEF SUMMARY OF THE INVENTION

A method is provided for forming an integrated circuit (IC) having field effect transistors (FET's) whose conductive channels lie in fins standing substantially perpendicular to a supporting substrate. Such FETs are hereafter referred to as FIN-FETs. The method includes, providing a substrate having thereon semiconductor fins of first fin height H1 and other semiconductor fins of second fin height H2 different than H1, forming sources and drains adapted to communicate with conductive channels induced in the fins, and forming gate structures at least on opposed sides of the fins adapted to induce the conductive channels, so that first FIN-FETs having fin height H1 and second FIN-FETs having fin height H2≠H1 are present on the same substrate.

An integrated circuit (IC) embodying multiple fin-type field effect transistors (FETs), hereafter referred to as FIN-FETs, is provided. The IC includes a common substrate, semiconductor fins oriented substantially perpendicular to the common substrate and adapted to have field induced channel regions of the FIN-FETs located within the semiconductor fins. Source, drain and gate regions are formed in or on the fins, so that a first of the FIN-FETs has fin height H1 above the common substrate and a second of the FIN-FETs has fin height H2 above the common substrate and H2≠H1.

A method is provided for making semiconductor fins suitable for use in fin-type field effect transistors, hereafter FIN-FETs, and ICs employing such FIN-FETs. The method includes, providing a substrate, forming on a first surface of the substrate a semiconductor layer of substantially uniform thickness H and having multiple lateral semiconductor regions therein, altering an etch rate of a first part of a first lateral semiconductor region of the semiconductor layer to a depth D1<H, removing the first part of the first lateral semiconductor region so that a remaining first lateral semiconductor region has thickness H1~H−D1 while another lateral semiconductor region still has thickness H. Before altering or after altering or after altering and removing, etching the semiconductor layer to provide semiconductor fins on the substrate of at least height H and H1, for use in some FIN-FETs having fin height H1 and other FIN-FETs having fin height H on the same substrate. In a preferred embodiment, altering the etch rate is accomplished by implanting etch rate altering ions in the first part of the first semiconductor region and removing is accomplished by differential etching of the etch-rate altered first part of the first semiconductor region. Annealing is desirably provided between implanting and differential etching to enhance the etch differential of the implanted part with respect to the un-implanted part.

The above described methods and structure overcome the undesirable channel width quantization effects that arise when multiple FIN-FETs formed on the same substrate all have the same fin height. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The invention will be better understood from a reading of the following detailed description, taken in conjunction with the accompanying figures in the drawings in which like numerals denote like or analogous elements, and wherein:

FIGS. 16-17 show a further manufacturing stage wherein the fin portions of FIGS. 5 and 10 are formed into finished FIN-FETs individually or as part of an IC on a common substrate, wherein FIG. 16 is a plan view and FIG. 17 is a cross-sectional view.

DETAILED DESCRIPTION OF THE INVENTION

Figure 1:
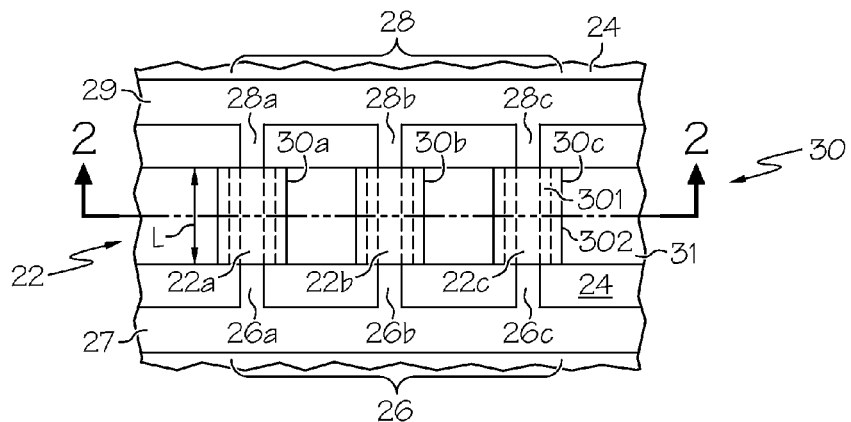
FIG. 1 shows a simplified plan view of a prior art FIN-FET individually or as part of an IC, employing multiple fins.

The following detailed description is merely exemplary in nature and is not intended to limit the invention or the application and uses of the invention. Furthermore, there is no intention to be hound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. Furthermore, the terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein.

The drawings and associated discussion illustrate FIN FETs formed of semiconductor material on supporting substrates. As used herein, the term "semiconductor", singular or plural, is intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, insulating substrates, and combinations thereof such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but it should be understood that the words "metal" and "conductor", singular or plural, are used interchangeably herein to include any type of electrical conductor, whether metallic or not. Semiconductors, doped semiconductors, metals, semimetals, metal alloys, semiconductor-metal alloys and combinations thereof are examples of useful electrical conductors. For convenience of explanation and not intended to be limiting, embodiments of the invention are described for FIN-FETs embodying silicon semiconductor, but persons of skill in the art will understand based on the explanations herein that other semiconductor materials may also be used.

Figure 2:
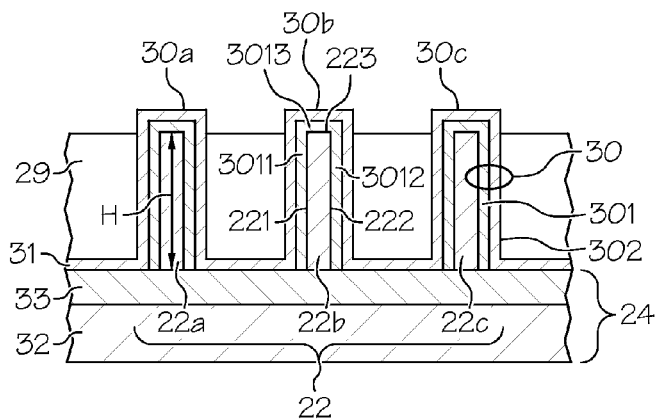
FIG. 2 shows a simplified cross-sectional view of the prior art FIN-FET of FIG. 1, individually or as part of an IC, illustrating a typical structure.

FIG. 1 shows a simplified plan view and FIG. 2 shows a simplified cross-sectional view of prior art FIN-FET 20 illustrating a typical structure. FIGS. 1 and 2 are discussed together. In this example, FIN-FET 20 comprises multiple semiconductor (SC) fins 22a, 22b, 22c (collectively 22) of substantially uniform height H, standing substantially upright on supporting substrate 24. Fins 22a, 22b, 22c of FIN FET 20 have, respectively, source regions 26a, 26b, 26c (collectively 26) coupled by source bus 27, drain regions 28a, 28b, 28c (collectively 28) coupled by drain bus 29, and gate structures 30a, 30b, 30c (collectively 30) overlying fins 22a, 22b, 22c, respectively. Gate structures 30 are coupled by gate bus 31 formed by conductor 302. Fins 22a, 22b, 22c with their sources 26, drains 28 and gate structures 30 are electrically in parallel. In this example, substrate 24 is a semiconductor-on-insulator (SOI) structure where semiconductor (SC) fins 22 are separated from sub-structure 32 (e.g., a semiconductor wafer or die) by dielectric layer 33, but this is not essential and in other embodiments, dielectric layer 33 may be omitted or other type of substrates may be used. Gate structure 30 overlying fins 22 has insulating layer 301 (e.g., the gate insulator) in contact with fins 22 overlain by gate conductor 302, which in this example also serves as common gate bus 31, but that is not essential. Because gate conductor 302 is proximate opposed sides 221, 222 of fins 22, a potential applied to gate conductor 302 readily controls the conductivity of the channel of length L along fins 22 between sources 26 and drains 28. Gate structure 30 also overlies upper edge 223 of fins 22, but that is not essential and in other embodiments, portion 3013 of insulator 301 overlying upper gate edge 223 may be substantially thicker than portions 3011, 3012 along opposed sides 221, 222 of fins 22. Either arrangement is useful.

Figure 3:
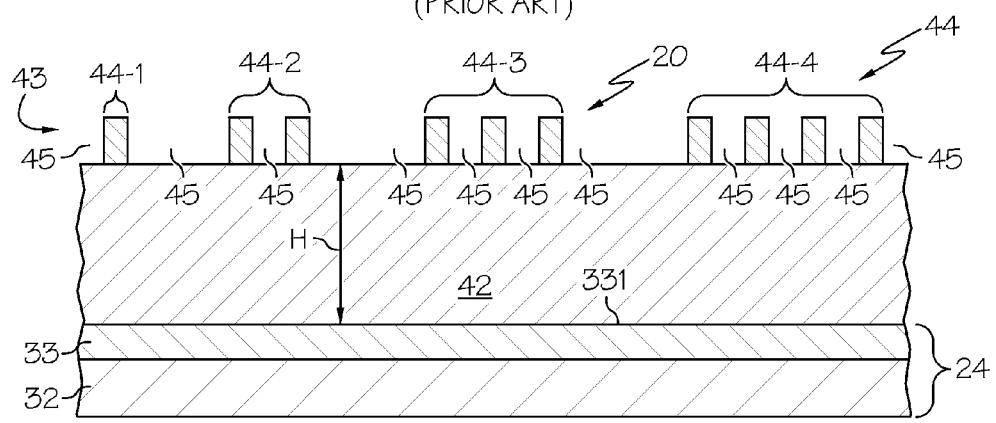
FIG. 3 show a simplified cross-sectional view during an initial stage of manufacture of several FIN-FETs analogous to those of FIGS. 1-2 individually or as part of an IC on the same substrate, each having different numbers of fins, according to the prior art.
Figure 4:
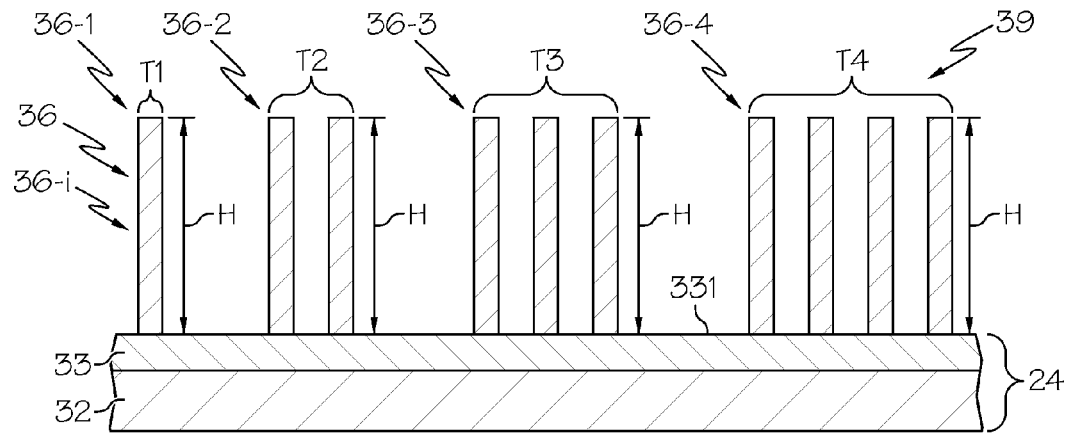
FIG. 4 shows a simplified cross-sectional view of just the fin portions of the FIN-FETs resulting from the manufacturing stage shown in FIG. 3, formed on a common substrate according to the prior art, and illustrating why channel-width dependent properties of such prior art FIN-FETs are quantized.

FIG. 3 show a simplified cross-sectional view during an initial stage of manufacture of several FIN-FETs analogous to those of FIGS. 1-2 on common substrate 24, each FIN-FET intended to have different numbers of fins of uniform height, according to the prior art. FIG. 4 shows a simplified cross-sectional view of just the fin portions of the FIN-FETs resulting from the manufacturing stage shown in FIG. 3, formed on common substrate 24 according to the prior art, and illustrating why channel width dependent properties of such prior art FIN-FETs are quantized. FIGS. 3-4 and discussed together.

Referring now to FIG. 3, FIN-FETs 20 are prepared by forming semiconductor (SC) layer 42 of substantially uniform thickness H on substrate 24. Etch mask 43 is provided on semiconductor layer 42, having blocking or closed portions 44-1, 44-2, 44-3, 44-4 (collectively 44) corresponding to the location and number of individual fins 36-1, 36-2, 36-3, 36-4 (generally 36-i, collectively 36) desired to be formed, as shown in FIG. 4. The portions of semiconductor layer 42 underlying openings 45 in mask 43 are anisotropically etched, using means well known in the art, until substrate 24 is reached, leaving behind SC fins 36-1, 36-2, 36-3, 36-4 (generally 36-i, collectively 36) standing substantially vertically on substrate 24 as shown in FIG. 4. Fins 36 are of substantially uniform height H corresponding substantially to thickness H of original semiconductor layer 42. The manufacturing stages illustrated in FIGS. 3 and 4 may be used to make the prior art structure illustrated in FIG. 4 as a precursor to finished FIN-FET 20 of FIGS. 1-2, or the manufacturing stages illustrated in FIGS. 3 and 4 may be used as the initial stages of manufacturing an improved device according to embodiments of the invention illustrated in FIG. 5 and elsewhere.

Referring now to the prior art structure of FIG. 4, fins 36-1, 36-2, 36-3, 36-4 are used to form multiple transistors T1, T2, T3, T4 (collectively multiple FIN-FETs 39) on common substrate 24 wherein each transistor T1, T2, T3, T4 has different numbers of fins 36-1, 36-2, 36-3, 36-4 respectively. When finished to include sources 26, drains 28 and gate structures 30 (see FIGS. 1-2), FIN-FETs 39 correspond to transistors 20 of FIGS. 1-2 but with different numbers of fins in each transistor T1, T2, T3, T4. Source, drain, gate structure and other details of FIN-FETs 39 have been omitted in FIG. 4 to avoid unduly cluttering the drawing. Transistors T1, T2, T3, T4 with fins 36 of substantially uniform height H each having different numbers of fins 36-1, 36-2, 36-3, 36-4, fabricated on common substrate 24, illustrate how channel width quantization occurs with such prior art devices, as is explained below.

Other things being equal, the power handling capability and on resistance (Rdson) of each of FIN-FETs T1, T2, T3, T4 are determined by the channel widths $W_{T1}$, $W_{T2}$, $W_{T3}$, and $W_{T4}$ of each of transistors T1, T2, T3, T4. The fins of each multi-fined transistor T1, T2, T3, T4 are electrically in parallel. The power handling capability $PMAX_{T1}$ of single-fin transistor T1 will be proportional to $W_{T1}$, where $W_{T1}$ is the channel width of transistor T1, which is proportional to fin height H. Thus, $PMAX_{T1}=f(c_1 W_{T1})$, where $c_1$ is a proportionality constant. Similarly. $PMAX_{T2}=f(c_1 W_{T2})$, $PMAX_{T3}=f(c_1 W_{T3})$, and $PMAX_{T4}=f(c_1 W_{T4})$, where $W_{T2}$, $W_{T3}$, and $W_{T4}$ are the total channel widths of transistors T2, T3, T4, respectively. Since all of transistors T1, T2, T3, T4 in FIG. 4 have the same fin height H and the multiple fins are electrically in parallel, the forgoing relations for PMAX may be expressed as $PMAX_{T1}=f(c_1 W_{T1})$, $PMAX_{T2}=f(2c_1 W_{T1})$, $PMAX_{T3}=f(3c_1 W_{T1})$, and $PMAX_{T4}=f(4c_1 W_{T1})$ where $W_{T1}$ is the channel width of single fin transistor T1 and transistors T2, T3, T4 have respectively, 2 fins, 3 fins and 4 fins of the same height and individual fin channel width $W_{T1}$. For analogous reasons, Rdson may be expressed as $Rdson_{T1}=f(c_2/W_{T1})$, $Rdson_{T2}=f(c_2/2W_{T1})$. $Rdson_{T3}=f(c_2/3W_{T1})$, $Rdson_{T4}=f(c_2/4W_{T1})$, where $c_2$ is another proportionality constant. From examining these relationships, it can be seen that where the various FIN-FETs on the same die or wafer have the same fin height H and thus the same channel width W per fin, that the values that may be obtained, for example for PMAX and Rdson, for different transistors Ti, i=1, 2, 3, . . . etc., on the same die or wafer are quantized, and intermediate channel width dependent parameter values cannot be readily obtained.

To see this more easily, take a simple example. Assume that $PMAX_{T1}=10X$, where X is a normalized value of $f(c_1 W_{T1})$. Then, other things being equal, $PMAX_{T2}=20X$, $PMAX_{T3}=30X$, and $PMAX_{T4}=40X$ and, since all fins have the same height H, no intermediate values can be obtained. For example, given the restriction of uniform fin height H on the same die or wafer, it is not possible to build a transistor with, for example, $PMAX_{Tj}=P*X$, where P takes on an value other than 10, 20, 30, 40, etc., for the same operating conditions. Other things being equal, analogous quantization occurs with Rdson. Assume for example that $Rdson_{T1}=100Y$, where Y is a normalized value of $f(c_2/W_{T1})$. Then, for equivalent operating conditions, $Rdson_{T2}=50Y$. $Rdson_{T3}=33Y$. $Rdson_{T4}=25Y$, and as long as all the fins have common height H, intermediate values of Rdson for the same operating conditions cannot be realized on the same die or wafer. Since there is often a need to provide several FEN-FETs of different channel width dependent properties on the same die or wafer, manufactured at the same time, the quantization noted above of channel width dependent properties, can be a significant handicap.

Figure 5:
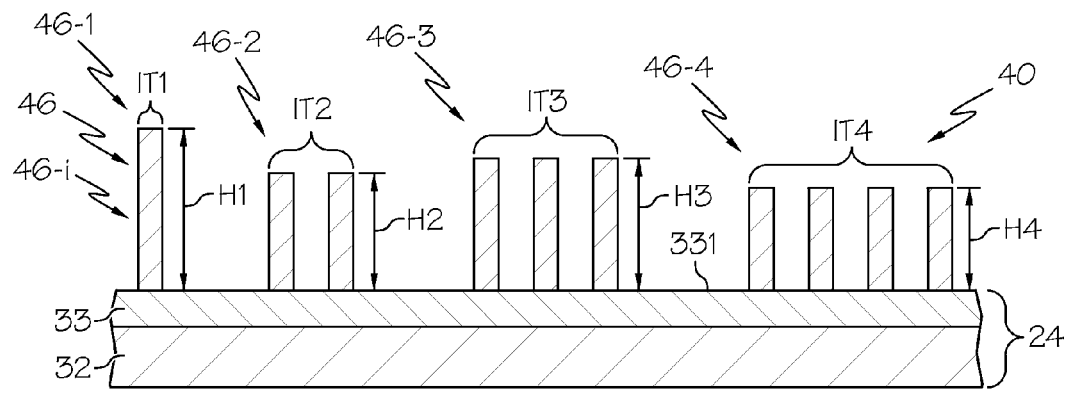
FIG. 5 shows a simplified cross-sectional view, analogous to that of FIG. 4 of just the fin portions of FIN-FETs formed on a common substrate, each having different numbers of fins, and showing how the prior art quantization of channel-width dependent properties may be overcome, according to an embodiment of the invention.

FIG. 5 shows a simplified cross-sectional view, analogous to that of FIG. 4 of just fins 46-1, 46-2, 46-3, 46-4 (generally 46-i, collectively 46) of improved FIN-FETs IT1, IT2, IT3, IT4 formed on common substrate 24. For convenience. FIN-FETS IT1, IT2, IT3, IT4 are referred to generally as FIN-FETs 40-i, i=1, 2, 3, 4, etc., and collectively as FIN-FETs 40. Single fin 46-1 has height H1, dual fins 46-2 have fin height H2, triple fins 46-3 have fin height H3 and quad fins 46-4 have fin height H4, in this example, all different. While only four FIN-FETs IT1, IT2, IT3, IT4 are shown in FIG. 5 and only exhibit four different fin heights H1, H2, H3, H4, this is merely for convenience of description and not intended to be limiting. Persons of skill in the art will understand based on the description herein that any number of improved FIN-FETs 40-i (i=1, 2, 3, . . . etc.) may be provided on a common substrate and any number of different fin heights Hj (j=1, 2, 3, . . . etc.) may be employed among the various FIN-FETs 40-i. Each FIN-FET 40-i has a different numbers of fins 46-i, and illustrates how the prior art quantization of channel width dependent properties may be overcome according to an embodiment of the invention, as is explained below. Source, drain, gate structure and other details of FIN-FETs 40 have been omitted in FIG. 5 to avoid unduly cluttering the drawing. When finished to include sources 26, drains 28 and gate structures 30 analogous to those regions shown in FIGS. 1-2, FIN-FETs 40 with different numbers of fins and different fin heights H1, H2, H3, H4 in each FIN-FET 40-i are illustrated in FIGS. 16-17.

It will be apparent that by being able to provide improved FIN-FETs 40-i (i=1, 2, 3, etc.) with different numbers of fins 46-i (i=1, 2, 3, etc.) and fins of different heights Hj (j=1, 2, 3 . . . etc.) that the channel width dependent parameter quantization problems encountered with uniform height FIN-FETs 39 of FIGS. 1-4 on the same substrate or die can be avoided.

This may be understood more clearly by a simple example. Assume for the moment that all improved FIN-FETs 40-i have the same fin height H1=H2=H3=H4=H, then as explained earlier, $PMAX_{IT1}=10X$, $PMAX_{IT2}=20X$, $PMAX_{IT3}=30X$, and $PMAX_{IT4}=40X$, where X is the normalized value of $f(c_1 W_{IT1})$. But $W_{IT1}$ depends on H, so the foregoing relations may be re-written as $PMAX_{IT1}=10c_3H1$, $PMAX_{IT2}=20c_3H2$, $PMAX_{IT3}=30c_3H3$, and $PMAX_{IT4}=40c_3H4$, where $c_3$ is another proportionality constant linking $c_1 W_{IT1}$ and H. For the case of H1=H2=H3=H4=H, then $c_3H=X$ and the same equations as before are obtained and the quantization problem is present. However, if fin heights H1, H2, H3, H4 can be independently varied, e.g. as illustrated in FIG. 5, then the quantization problem may be avoided. For example, the ratio $PMAX_{IT4}/PMAX_{IT3}=40c_3H4/30c_3H3=(4/3)(H4/H3)$. For H4=H3, $PMAX_{IT4}/PMAX_{IT3}=4/3$, i.e., the ratio is quantized. However, if H3 and H4 can be independently varied, as illustrated in FIG. 5, then the ratio $PMAX_{IT4}/PMAX_{IT3}=(4/3)(H4/H3)$ is no longer quantized and any desired ratio $PMAX_{IT4}/PMAX_{IT3}$ can be obtained by independently varying H3 and H4. The same analysis applies to any channel width dependent device parameter. Thus, the ability to provide different fin heights for different FIN-FETs on the same substrate permits the prior art channel width quantization problem to be avoided. This is a significant advance in the art.

Figure 8:
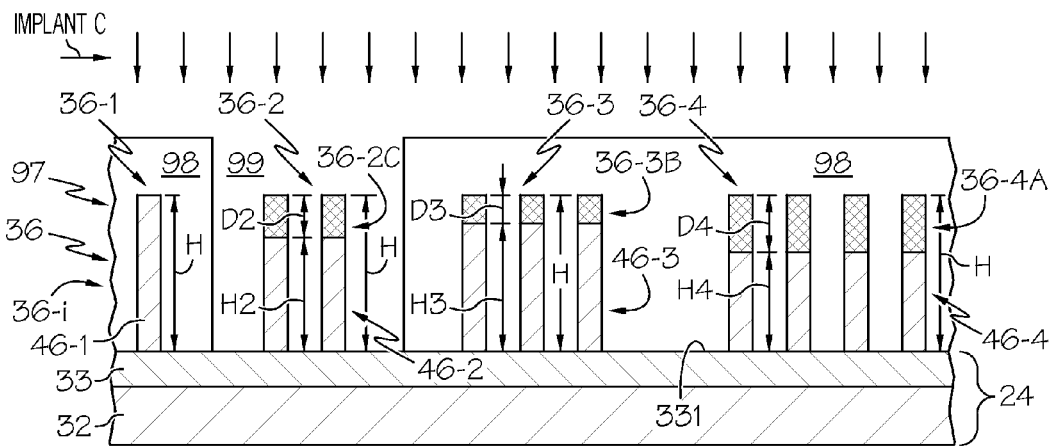
Figure 9:
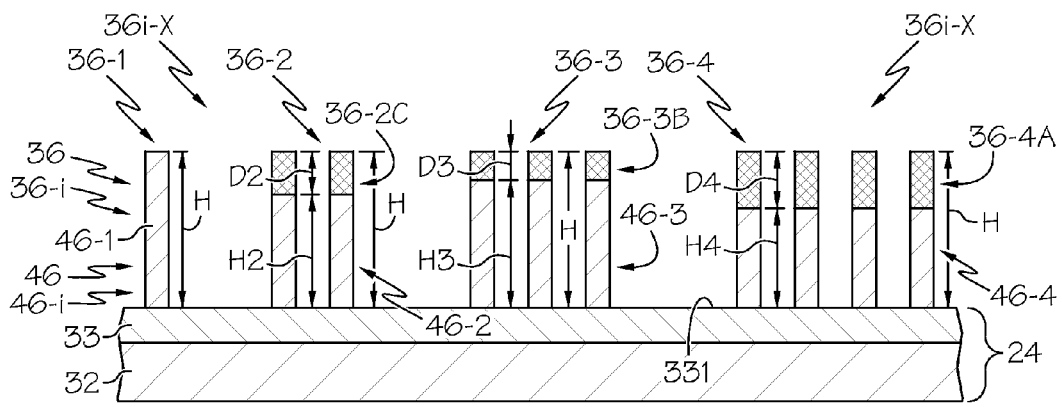
Figure 10:
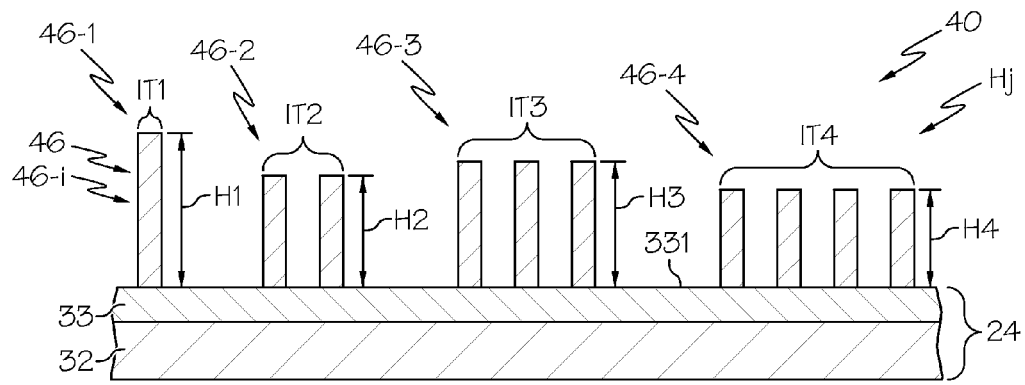
Figure 16:
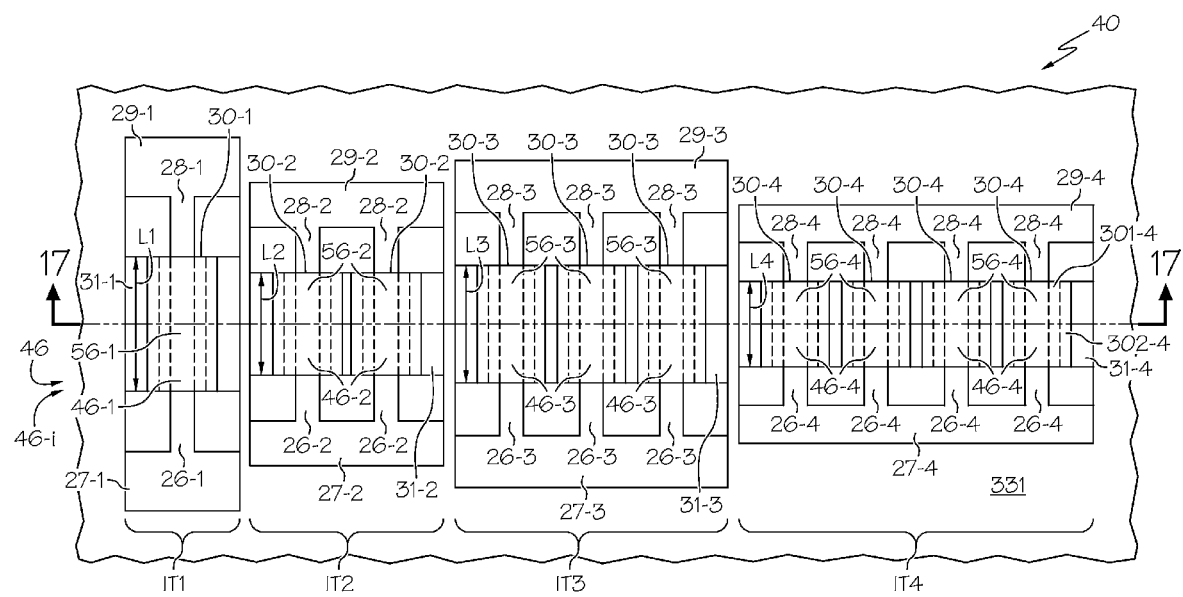
Figure 17:
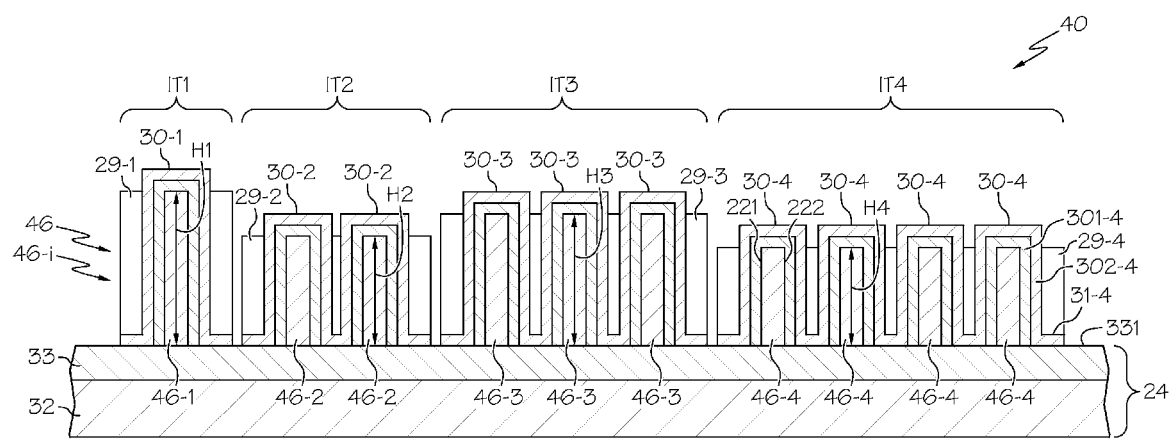

FIGS. 6-10 show simplified cross-sectional views of fin portions 46 of FIG. 5 being formed on common substrate 24 during various stages 506-510 of manufacture, according to further embodiments of the invention and FIGS. 16-17 show a further manufacturing stage 516 where fin portions 46 of FIGS. 5 and 10 are formed into finished FIN-FETS 40 on common substrate 24, according to yet further embodiments of the invention. Referring now to FIGS. 6-10, prior to manufacturing stage 506 of FIG. 6, prior art manufacturing stages 503-504 are desirably carried out to provide structures 603, 604 having fins 36-1, 36-2, 36-3, 36-4 of substantially equal height H illustrated in FIGS. 3-4. That is, substrate 24 is provided, semiconductor layer 42 of thickness H is formed thereon, and mask 43 with closed portions 44-1, 44-2, 44-3, 44-4 (generally 44-$i$, collectively 44) and open regions 45 is provided over SC layer 42. Structure 603 resulting from manufacturing stage 503 is anisotropically etched in manufacturing stage 504 to provide structure 604, wherein SC fins 36-1, 36-2, 36-3, 36-4 (generally 36-$i$, collectively 36) of substantially uniform height H are obtained.

Figure 6:
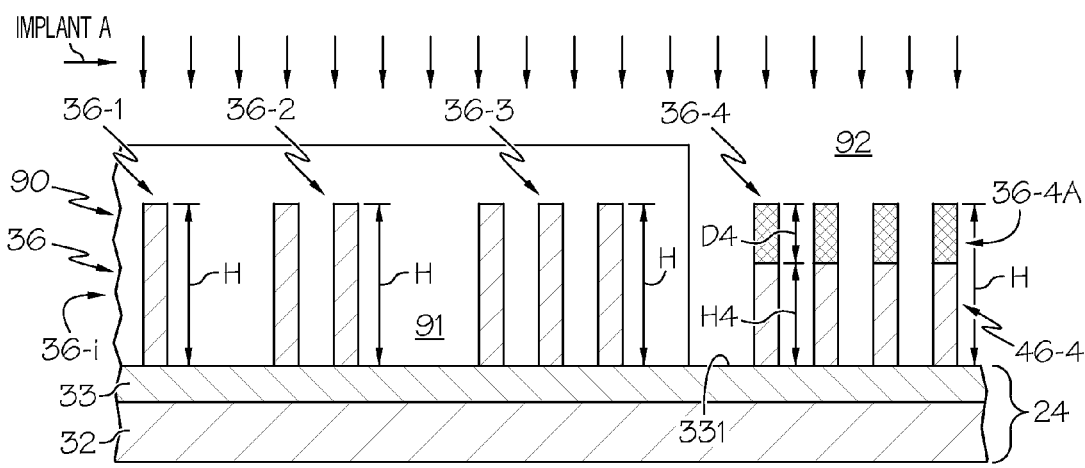
FIGS. 6-10 show simplified cross-sectional views of the fin portions of FIG. 5 being formed on a common substrate during various stages of manufacture, according to further embodiments of the invention.

Referring now to manufacturing stage 506 of FIG. 6, following manufacturing stage 504, structure 604 of FIG. 4 is provided with mask 90 having closed portion 91 and open portion 92. In this example, closed portion 91 covers and protects fins 36-1, 36-2, 36-3 and open portion 92 exposes fins 36-4. However, open portion 92 may be located over any of fins 36 depending upon which of fins 36-$i$ ($i$=1, 2, 3, . . . etc.) are desired to have their heights Hj ($j$=1, 2, 3, . . . etc.) adjusted. Implant A is provided through open portion 92 of mask 90 into upper portions 36-4A of fins 36-4 to depth D4 of fin height H, leaving underlying portions 46-4 of height H4~(H−D4) of fins 36-4 substantially unaffected. The purpose of Implant A is to render portions 36-4A of depth D4 of fins 36-4 differentially etchable with respect to underlying portions 46-4 of height H4 of fins 36-4.

D4 is determined, among other things, by the energy of Implant A and techniques for determining the implant penetration depth D4 as a function of the target material and the ions being implanted are well known in the art. Accordingly the implant energy will be chosen by the designer depending on the materials being used, the initial fin height H and the desired final height H4 (see FIG. 5) of fins 46-4. This is within the competence of those of skill in the art. Any type of implant tools may be used. Plasma source implanters, such as those manufactured by Applied Materials of Santa Clara, Calif. USA are preferred but other types of commercially available implant equipment may also be used. Multiple energy implants are preferred since they permit a more uniform doping as a function of depth to be obtained, but this is not essential.

There are, in general, a variety of materials that may be used for Implant A to achieve adequate differential etching, depending upon the semiconductor (SC) being used for fins 36. It is known that implanting almost any impurity into a solid tends to increase its etch rate relative to the same un-implanted material due to the structural damage produced by the energetic ions of the implant. However, greater etch rate differentiation can be obtained by using implant ions that dope the receiving material, that is, that form chemical compounds that themselves exhibit differential etching compared to the un-doped material. For silicon (Si) semiconductor, oxygen, nitrogen and germanium (Ge) are non-limiting examples of materials known to produce silicon compounds 36-4A that may be differentially etched with respect to un-implanted portions 46-4 of fins 36-4. Germanium is preferred. It has been found that Ge implant doses of at least about 1E14 ions/cm$^2$ are useful, with at least about 1E15 ions/cm$^2$ being convenient and at least about 1E16 ions/cm$^2$ being preferred, to yield adequate etch differentiation, so that implanted portions 36-4A may be subsequently removed while leaving lower portion 46-4 of fins 36-4 substantially unaffected, but higher and lower doses may also be used. Structure 606 results from manufacturing stage 506. Stated another way, the implanted ion concentration in region 36-4A is usefully at least about 1E19 ions/cm$^3$, more conveniently, at least about 1E20_ions/cm$^3$, and preferably at least about 1E21 ions/cm$^3$, but higher and lower concentrations may also be used. Stated still another way, the ratio of the etch rate of portion 36-4A to un-implanted portion 46-4 is usefully at least about 5 to 1, more conveniently at least about 10 to 1, and preferably at least about 100 to 1, but higher and lower ratios may also be used. Etching of implanted regions 36-4A is discussed later.

The foregoing discussion with respect to the choice of implant materials, semiconductors, implant tools, implant doses, concentrations, etch ratios, etc. presented in connection with manufacturing stage 506 also applies to manufacturing stages 507-509, and is incorporated therein by reference. Person of skill in the art will also understand that other implant ions and implant conditions may be chosen in other embodiments.

Figure 7:
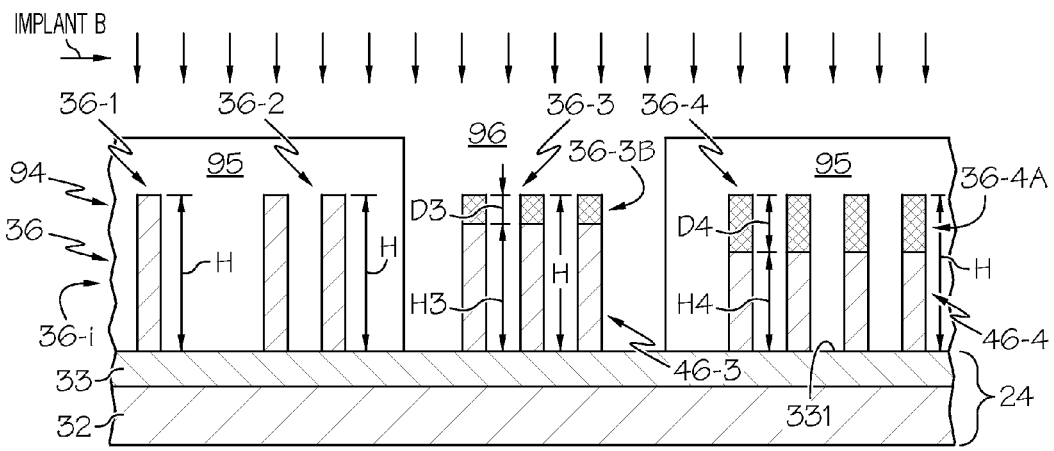

In manufacturing stage 507 of FIG. 7, mask 90 is removed and replaced by mask 94 having, for example, closed portions 95 and open portion 96. In this example, open portion 96 exposes fins 36-3 and closed portions 95 protect fins 36-1, 36-2 and 36-4, but as has already been explained, different groups of fins 36 may be exposed or protected as needed to provide transistors having channel widths required by the circuit being implemented. Implant B is provided through open portion 96 into upper portions 36-3B of depth D3 of fins 36-3, leaving lower portions 46-3 of fins 36-3 substantially unaffected. The energy of Implant B in manufacturing stage 507 is adjusted to take into account any differences in desired implant depth D3 and final fin height H3 compared to implant depth D4 and final fin height H4 desired in stage 506. Otherwise, substantially the same conditions and materials may be used. Structure 607 results from manufacturing stage 507. Etching of implanted regions 36-3B is discussed later.

In manufacturing stage 508 of FIG. 8, mask 94 is removed and replaced by mask 97 having, for example, closed portions 98 and open portion 99. In this example, open portion 99 exposes fins 36-2 and closed portions 98 protect fins 36-1, 36-3 and 36-4, but as has already been explained, different groups of fins 36 may be exposed or protected in other embodiments. Implant C is provided through open portion 99 into upper portions 36-2C of depth D2 of fins 36-2, leaving lower portions 46-2 of fins 36-2 substantially unaffected. The energy of Implant C in manufacturing stage 508 is adjusted to take into account any differences in desired implant depth D2 and final fin height H2 compared to implant depth D4 and final fin height H4 desired in stage 506. Otherwise, substantially the same conditions and materials may be used. Structure 608 results from manufacturing stage 508. Etching of implanted regions 36-2C is discussed later.

In manufacturing stage 509 of FIG. 9, mask 97 is desirably removed. Since in this example, no further fin regions remain that need be implanted, structure 609 of FIG. 9 is desirably subjected to an annealing step to promote the formation of an etch sensitive compound (e.g., $Si_xGe_y$) in implanted regions 36-4A, 36-3B, 36-2C. For convenience of future reference, implanted regions 36-4A, 36-3B, 36-2C are referred to generally and collectively hereafter as "implanted regions 36-$iZ$", where the index $i$=1, 2, 3, 4, 5, . . . N identifies any chosen group of fins 36-$i$ and Z refers to the implants (e.g. A, B, C, . . . etc.) provided to such fins. Annealing is desirably carried out in a generally inert atmosphere at temperatures usefully in the range from about 500 to 1350 degrees centigrade, more conveniently in the range from about 700 to 1350 degrees centigrade, and preferably in the range from about 800 to 1300 degrees centigrade, but higher or lower temperatures may also be used. Anneal times are usefully in the range of about 1 micro second to 30 minutes, more conveniently in the range of about 100 micro second to 2 minutes, and preferably in the range of about 100 microsecond to 10 seconds, but longer or shorter anneal times may also be used, and as is well understood in the art, in general, the higher the anneal temperature, the shorter the anneal time that can be used. Nitrogen is a non-limiting example of a suitable annealing atmosphere, but other atmospheres can also be used. Structure 609 results from manufacturing stage 509.

In manufacturing stage 510 of FIG. 10 annealed structure 609 of FIG. 9 is subjected to differential etching to remove implanted portions or regions 36-iZ leaving behind in this example, fin 46-1 of height H1 (in this example, H1=H), fins 46-2 of height H2, fins 46-3 of height H3 and fins 46-4 of height H4 as shown by structure 610 of FIG. 10 and in FIG. 5. Where fins 36 and 46 are substantially silicon and implants Z=A, B, C, etc., comprise Ge, it is found that hydrochloric (HCl) acid is an effective differential etchant for removing implanted regions or portions 36-iZ of structure 609 of FIG. 9 which comprise $Si_xGe_y$, where x and y depend on the implant dose, to provide structure 610 of FIG. 10, but other etchants may also be used. HCl vapor etching is preferred, usefully carried out at pressures in the range of about 1 to about 1000 Torr and temperatures in the range of about 500 to 1000 degrees centigrade, more conveniently carried out at pressures in the range of about 10 to about 1000 Torr and temperatures in the range of at about 600 to 1000 degrees centigrade, and preferably carried out at pressures in the range of about 10 to about 600 Torr and temperatures in the range of at about 500 to 700 degrees centigrade, but higher and lower pressures and/or temperatures may also be used. Structure 610 results from manufacturing stage 510. Structure 610 of FIG. 10 illustrates how structure 605 of FIG. 5 can be obtained.

Annealing and etching of implanted regions 36-iZ described above may alternately be performed in other embodiments while individual implant masks 90, 94, 97, etc. remain in place, or after each is removed and before the next implant mask is applied, or a combination thereof, or may be deferred until all implants Z have been completed and annealed, as has been illustrated in the embodiment of FIGS. 9-10. Either procedure is useful in various embodiments. In a preferred embodiment, annealing and etching are delayed as shown in FIGS. 9-10 until the above-described implants have been completed.

FIGS. 11-15 show simplified cross-sectional views of the fin portions 46 of FIG. 5 being formed on common substrate 24 during various stages of manufacture 511-515, according to still further embodiments of the invention, and FIGS. 16-17 show further manufacturing stage 516 where fin portions 46 of FIGS. 5 and 10 are formed into finished FIN-FETS 40 on common substrate 24, according to yet further embodiments of the invention. Prior to manufacturing stage 511 of FIG. 11, substrate 24 is provided and semiconductor layer 42 of thickness H is formed thereon. In manufacturing stage 511 of FIG. 11, mask 90' is provided on semiconductor layer 42 with closed portion 91' and open portion 92'. Implant A is provided through open portion 92' into underlying portion 42-4A of layer 42 to depth D4, leaving underlying portion 46-4' substantially unaffected. Implant A corresponds in dose and energy to Implant A already described in connection with FIG. 6. Portion 42-4A is rendered differentially etchable in much the same way as has already been described for region or portion 36-4A of FIG. 6. Structure 611 results from manufacturing stage 511. Etching of implanted regions 42-4A is discussed later.

Figure 11:
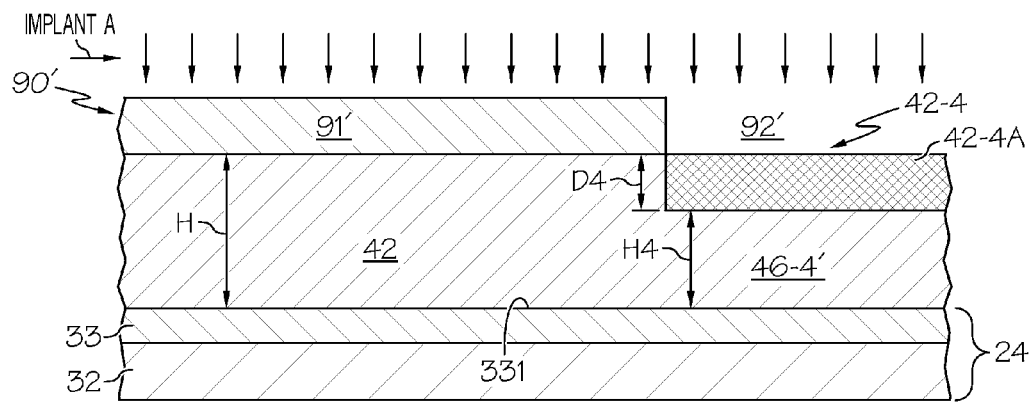
FIGS. 11-15 show simplified cross-sectional views of the fin portions of FIG. 5 being formed on a common substrate during various stages of manufacture, according to still further embodiments of the invention.
Figure 12:
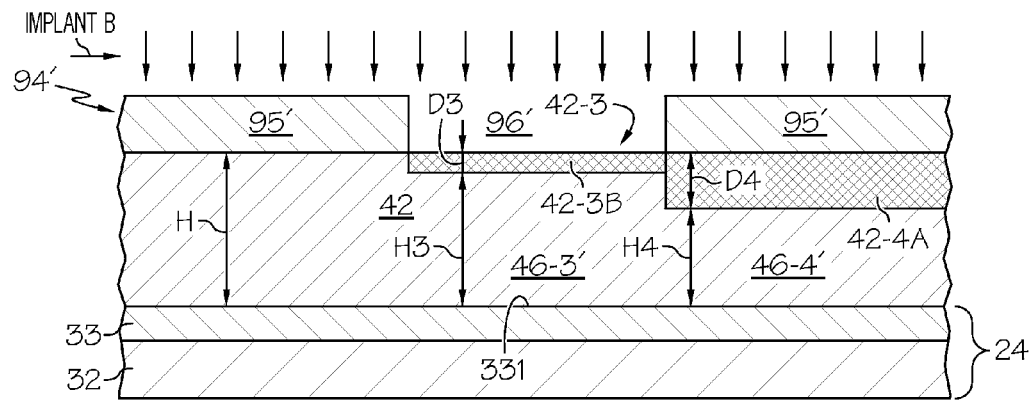

In manufacturing stage 512 of FIG. 12, mask 90' of FIG. 11 is removed and replaced by mask 94' having, for example, closed portions 95' and open portion 96'. In this example, open portion 96' exposes portion 42-3 of semiconductor layer 42 and closed portions 95' protect other portions of layer 42. Implant B is provided through open portion 96' into upper portions 42-3 of depth D3 leaving lower portions 46-3' of layer 42 substantially unaffected. Implant B corresponds in dose and energy to Implant B already described in connection with FIG. 7. Implanted portion 42-3B is rendered differentially etchable in much the same way as has already been described for region or portion 36-4B of FIG. 7. Structure 612 results from manufacturing stage 512. Etching of implanted portion 42-3B is discussed later.

Figure 13:
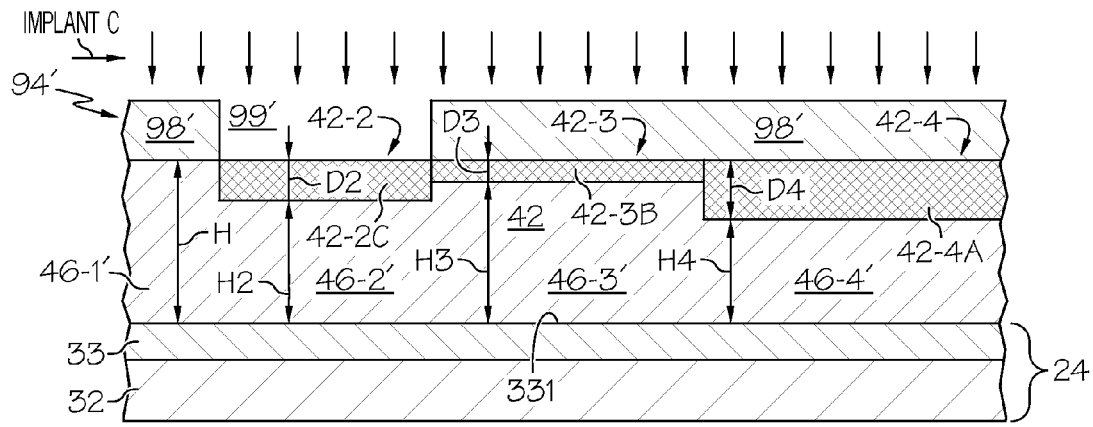

In manufacturing stage 513 of FIG. 13, mask 94' of FIG. 11 is removed and replaced by mask 97' having, for example, closed portions 98' and open portion 99'. In this example, open portion 99' exposes portion 42-2 of semiconductor layer 42 and closed portions 98' protect other portions of layer 42. Implant C is provided through open portion 99' into upper portion 42-2 of depth D2 leaving lower portions 46-2' of layer 42 substantially unaffected. Implant C corresponds in dose and energy to Implant C already described in connection with FIG. 8. Implanted portion 42-2C of depth D2 is rendered differentially etchable in much the same way as has already been described for region or portion 36-2C of FIG. 8. Structure 613 results from manufacturing stage 513. Etching of implanted portion 42-2C is discussed later.

Figure 14:
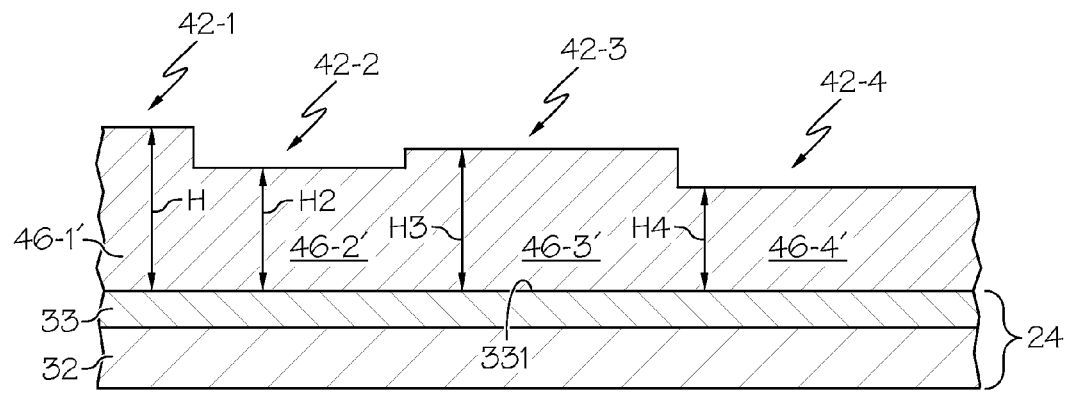

In manufacturing stage 514 of FIG. 14, mask 97' is desirably removed. Since in this example, no further thickness adjustments need be made, structure 613 of FIG. 13 is desirably subjected to an annealing step to promote the formation of an etch sensitive compound (e.g., $Si_xGe_y$) in implanted regions 42-4A, 42-3B, 42-2C of FIG. 13, referred to generally and collectively hereafter as "implanted regions 42-iZ", where the index i=1, 2, 3, 4, 5, . . . N identifies any chosen portion 42-i of semiconductor layer 42 and Z refers to the implant (e.g., A, B, C, . . . etc.) provided to such portions. Annealing is desirably carried in substantially the same manner as has already been described in connection with FIG. 9. Etching of structure 613 of FIG. 13 (absent mask 94') is also carried out in substantially the same manner as has already been described in connection with FIG. 9, resulting in structure 614 of FIG. 14.

In manufacturing stage 515, etch mask 43' is provided on selectively thinned semiconductor layer 42, having blocking or closed portions 44'-1, 44'-2, 44'-3, 44'-4 (collectively 44') corresponding to the location and number of individual fins 46-1, 46-2, 46-3, 46-4 (generally 46-i, collectively 46) desired to be formed, as shown in FIGS. 5 and 10. The various portions of semiconductor layer 42 underlying openings 45' in mask 43' are anisotropically etched, using means well known in the art, until substrate 24 is reached, leaving behind SC fins 46-1, 46-2, 46-3, 46-4 (generally 46-i, collectively 46) standing substantially vertically on substrate 24 as shown in FIGS. 5 and 10. Fins 46 have heights H1, H2, H3, H4 (see FIG. 10) analogous to heights H1, H2, H3, H4 provided by manufacturing stages 506-510 previously described.

Figure 15:
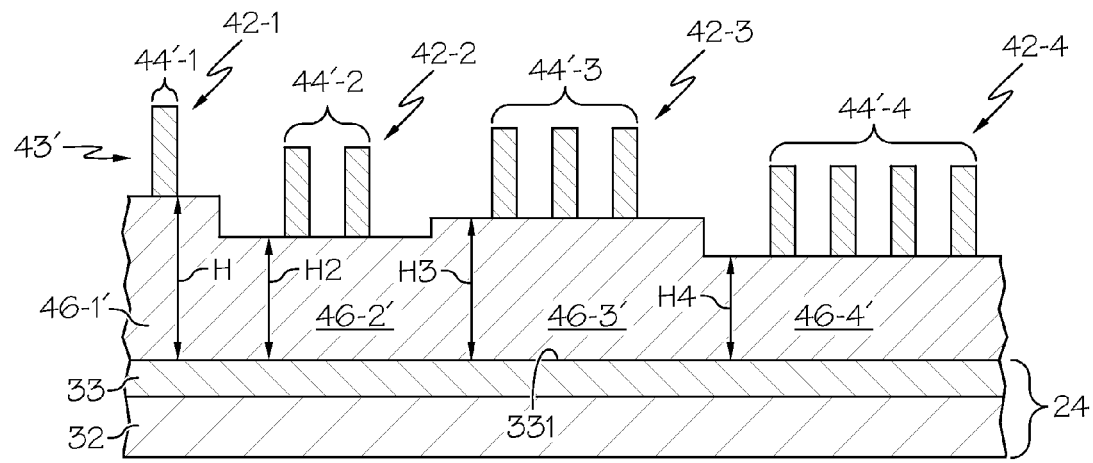

Annealing and etching of implanted regions 42-iZ described above may alternately be performed in still other embodiments while individual implant masks 90', 94', 97', etc., remain in place, or after each is removed and before the next implant mask is applied, or a combination thereof, or may be deferred until all implants Z have been completed and annealed, as has been illustrated in the embodiment of FIG. 14. Further, etching to provide fins 46-$i$ may be performed after thinning each portion 42-$i$ of SC layer 42 and before thinning other portions of SC layer 42 or such fin etch may be performed after more than one portion of SC 42 has been selectively thinned, or may wait until all thinning operations have been completed, as is illustrated in FIG. 15. Any combination of such procedures is useful in various yet further embodiments. In a preferred embodiment, annealing, thinning etch and fin etching are delayed and performed together, as shown in FIGS. 10-15. Structure 610 of FIG. 10 results from manufacturing stages 511-515.

In the particular examples presented in FIGS. 11-15, the height H1 of semiconductor layer portion 42-1 was not altered, but persons of skill in the art will understand that this is merely by way of example and not limitation. The procedure illustrated in FIGS. 11-15 may be repeated any desired number of times to adjust the heights of any of fins 46-$i$ ($i$=1, 2, 3, ... N) to provide any desired mix of heights Hj ($j$=1, 2, 3, ... etc.). Thus, the variable height fins formed on the same substrate depicted in FIGS. 10 and 5 are achieved, and the discussion in connection with FIG. 5 explains how this permits channel width dependent parameter quantization effects present in the prior art to be avoided.

Referring now to manufacturing stage 516 of FIGS. 16-17, where FIG. 16 is a simplified plan view analogous to that of FIG. 1 and FIG. 17 is a simplified cross-sectional view analogous to FIG. 2, but of completed FIN-FETs 40 based on fin structure 610 of FIG. 10, formed on upper surface 331 of substrate 24. FIGS. 16-17 show FIN-FETs IT1, IT2, IT3, IT4 (generally 40-$i$, collectively 40) after: (i) sources 26-1, 26-2, 26-3, 26-4 (generally 26-$i$, collectively 26), (ii) source buses 27-1, 27-2, 27-3, 27-4 (generally 27-$i$, collectively 27), (iii) drains 28-1, 28-2, 28-3, 28-4 (generally 28-$i$, collectively 28), (iv) drain busses 29-1, 29-2, 29-3, 29-4 (generally 29-$i$, collectively 29), (v) gate structures 30-1, 30-2, 30-3, 30-4 (generally 30-$i$, collectively 30), and (vi) gate buses 31,-1, 31-2, 31-3, 31-4 (generally 31-$i$, collectively 31), have been provided in connection with fins 46-1, 46-2, 46-3, 46-4 (generally 46-$i$, collectively 46), of FIN-FETs 40 of FIG. 10. In this example FIN-FETs 40 have different fin heights H1, H2, H3, H4, adapted (when gate structures 30-$i$ are appropriately biased) to form conductive channels 56-1, 56-2, 56-3, 56-3 (generally 56-$i$, collectively 56) therein extending between sources 26-$i$ and drains 28-$i$. It will also be noted by way of example and not intended to be limiting that channel lengths L1, L2, L3, L4 along conductive channels 56-$i$ between sources 26-$i$ and drains 28-$i$ may be the same or different for any or all of FIN-FETs 40. Persons of skill in the art will understand how to form elements (i)-(vi) depending upon the particular device configuration that they have adopted to arrive at structure 616 depicted in FIGS. 16-17 or equivalents. Improved FIN-FETs 40 of FIGS. 16-17 are shown as being electrically separate although formed on upper surface 331 of common substrate 24, but this is merely for convenience of illustration and persons of skill in the art will understand that FIN-FETs 40 may be electrically coupled in any manner desired by the designer or left as wholly or partially isolated devices on a common substrate, depending upon the needs of the overall circuit being created. Further, fewer or more than the four FIN-FETs illustrated in FIGS. 16-17 may be provided on common substrate 24 having different fin heights and the same or different channel lengths Li ($i$=1, 2, 3, ... N) according to the needs of the particular design.

Figure 18:
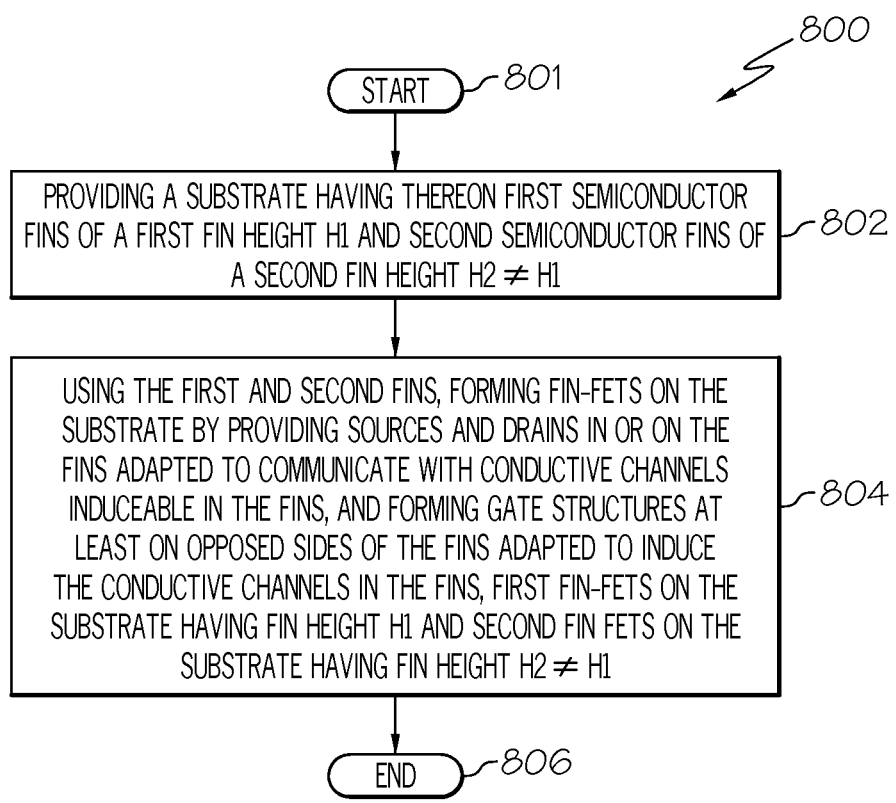
FIGS. 18-24 show simplified block diagrams of methods for fabricating the illustrative FIN-FETs of FIGS. 16 and 17 individually or as part of ICs, according to yet further embodiments of the invention.

FIGS. 18-24 show simplified block diagrams of method 800 for fabricating illustrative fins of FIG. 10 and illustrative FIN-FETs of FIGS. 16-17, according to still further embodiments of the invention. Referring now to FIG. 18, method 800 begins with START 801 and initial step 802 wherein there is provided a substrate (e.g. 24) having thereon first semiconductor fins (e.g. 46-$i$) of first fin height H1 and second fins (e.g. 46-$j \neq i$) of fin height H2$\neq$H1. (Initial step 802 is illustrated for example, in FIGS. 3-4 and 6-10 and in FIGS. 11-15.) In step 804, FIN-FETs (e.g., 40) are formed on the substrate (e.g., 24) using the fins (e.g., 46) by providing sources (e.g., 26), drains (e.g., 28) in or on the fins (e.g., 46), adapted to communicate with conductive channels (e.g., 56-$i$) induceable in the fins (e.g., 46), and forming gate structures (3.g, 30-$i$) at least on opposed sides (e.g., 221, 222) of the fins (e.g., 46), adapted to induce the conductive channels (e.g., 56-$i$) in the fins (e.g., 46), first FIN-FETs (e.g., 40-$i$) on the substrate (e.g., 24) having fin height H1 and second FIN-FETs (e.g., 40-$j \neq i$) on the substrate (24) having fin height H2$\neq$H1. (Step 804 is illustrated for example in FIGS. 16-17.) Method 800 then proceeds to END 806.

Figure 19:
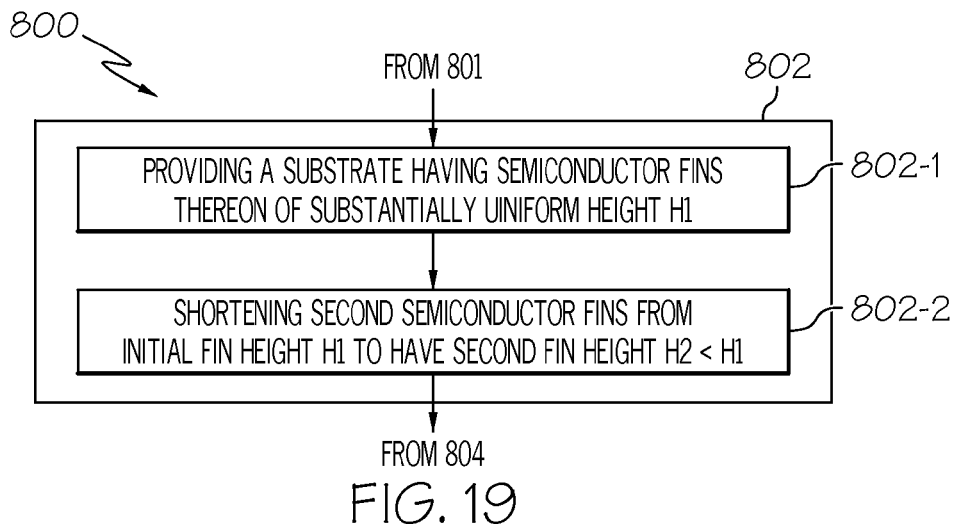

Referring now to FIG. 19, which provides further details concerning initial step 802, according to an additional embodiment. Step 202 of FIG. 19 begins with step 802-1 wherein there is provided a substrate (e.g. 24) having thereon semiconductor (SC) fins (e.g., 36) of substantially uniform height H1. In step 802-2, the second semiconductor fins (e.g., 36-$j$) are shortened from initial fin height H1 to have second fin height H2<H1. Method 800 then proceeds to step 804 of FIG. 18.

Figure 20:
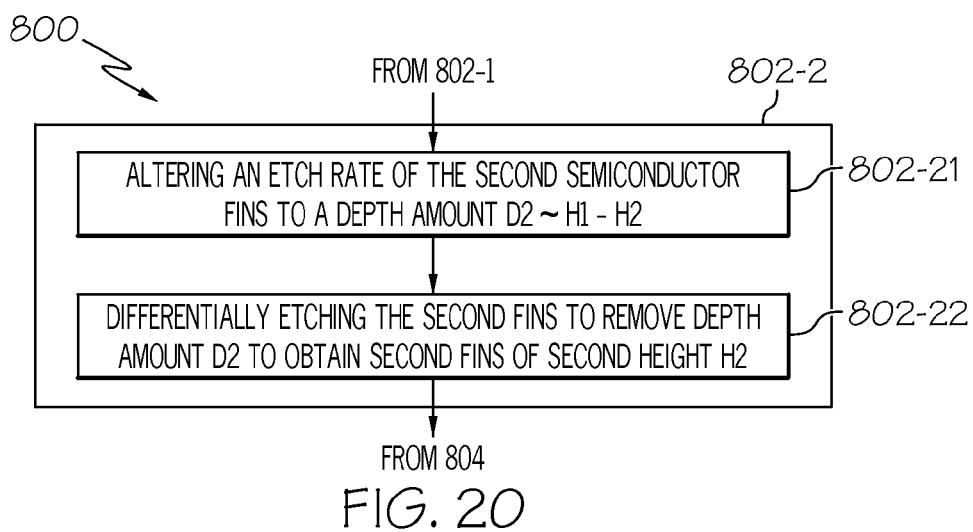

Referring now to FIG. 20, which provides further details concerning initial step 802-1, but according to a yet additional embodiment. Step 802-1 of FIG. 20 begins with step 802-21, wherein an etch rate of the second semiconductor fins (e.g., 36-$j \neq i$) is altered to a depth amount D2~H1−H2. Method 800 then continues with step 802-22 wherein the second semiconductor fins (e.g., 36$j \neq i$) are differentially etched to remove depth amount D2 to obtain second semiconductor fins (46-$j \neq i$) of second height H2. Method 800 then proceeds to step 804 of FIG. 18.

Figure 21:
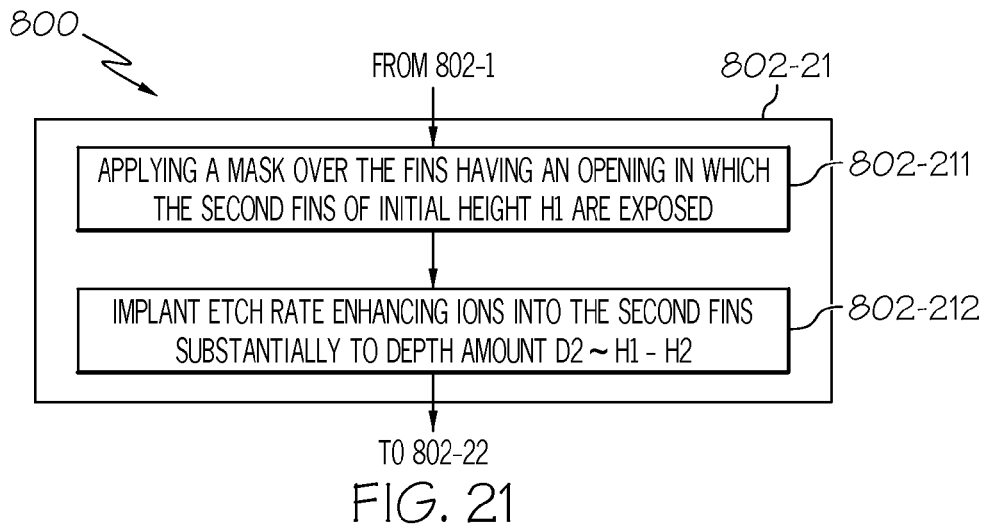

Referring now to FIG. 21, which provides further details concerning initial step 802-21, but according to a still yet additional embodiment. Step 802-21 of FIG. 21 begins with step 802-211, wherein a mask (e.g., 90, 94, 97) is applied over the fins (e.g. 36) having an opening (92, 96, 99) in which the second semiconductor fins (36-$j \neq i$) of initial height H1 are exposed. In step 802-212, etch rate enhancing ions (e.g., A, B, C) are implanted into the second semiconductor fins (36-$j \neq i$) substantially to depth amount D2~H1−H2. Method 800 then proceeds to step 802-22 of FIG. 20.

Figure 22:
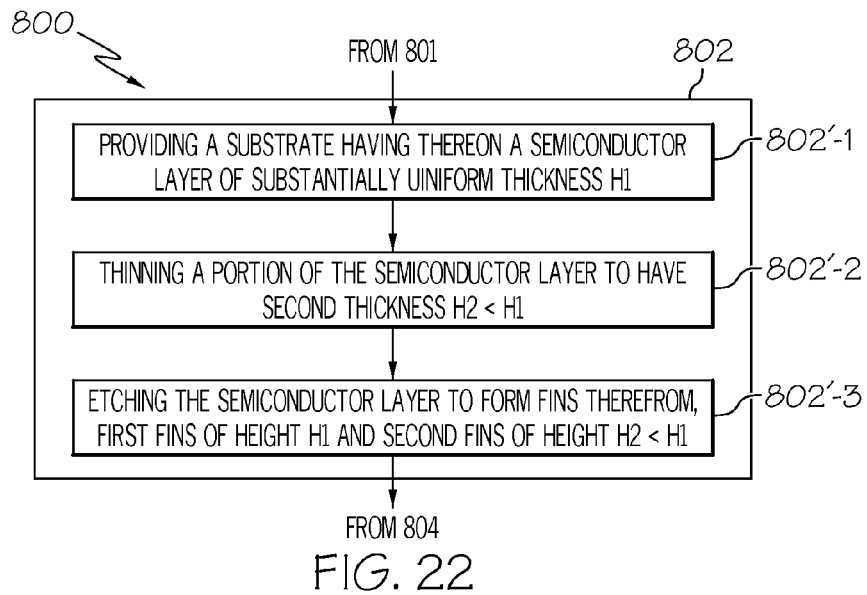

Referring now to FIG. 22, which provides further details concerning initial step 802, according to a yet still additional embodiment. Step 802 of FIG. 19 begins with step 802'-1 wherein there is provided a substrate (e.g., 24) having thereon a semiconductor (SC) layer (e.g. 42) of substantially uniform thickness H1. In step 802'-2, a portion (e.g., 42-$j$) of the SC layer (e.g., 42) is thinned from initial thickness H1 to have second thickness H2<H1. In step 802'-3, the SC layer (e.g., 42) is etched to form fins (e.g. 46) therefrom, first fins (e.g., 46-$i$) of height H1 and second fins (e.g., 46-$j \neq i$) of height H2<H1. Method 800 then proceeds to step 804 of FIG. 18.

Figure 23:
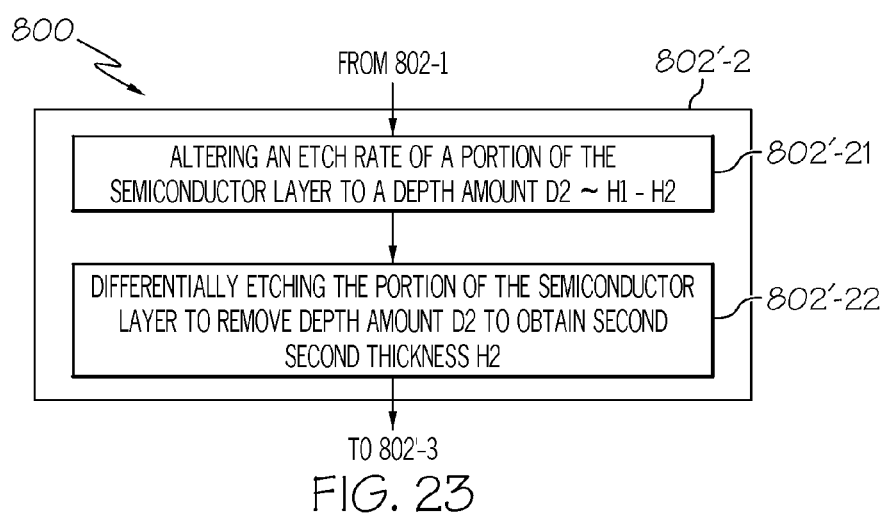

Referring now to FIG. 23, which provides further details concerning step 802'-2, but according to another additional embodiment. Step 802'-2 of FIG. 23 begins with step 802'-21, wherein an etch rate of a portion (e.g., 42-$j \neq i$) of the SC layer (e.g., 42) is altered to a depth amount D2~H1−H2. Method 800 then continues with step 802'-22 wherein the portion (e.g., 42-$j$) is differentially etched to remove depth amount D2 to obtain second thickness H2. Method 800 then proceeds to step 802'-3 of FIG. 22.

Figure 24:
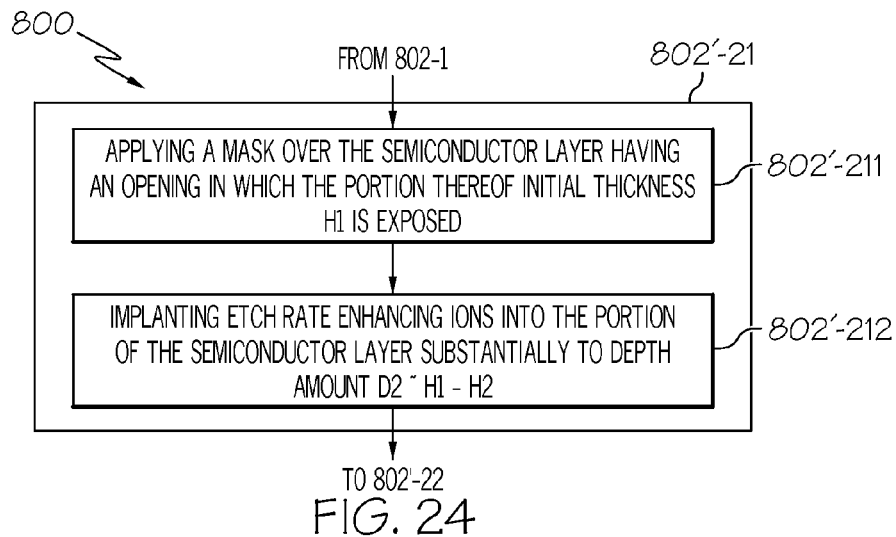

Referring now to FIG. 24, which provides further details concerning step 802'-21, but according to a still another additional embodiment. In FIG. 24, step 802'-21 of FIG. 23 begins with step 802'-211, wherein a mask (e.g., 90', 94', 97') is applied over the SC layer (e.g., 42) having an opening (92', 96', 99') in which the portion (e.g., 42-$j\neq i$) of the SC layer (e.g., 42) is exposed. In step 802'-212, etch rate enhancing ions (e.g., A, B, C) are implanted into the portion (e.g., 42-$j\neq i$) of the SC layer (e.g. 42) substantially to depth amount D2~H1−H2. Method 800 then proceeds to step 802'-22 of FIG. 23.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set firth in the appended claims and their legal equivalents.

What is claimed is:

1. A method for forming an integrated circuit (IC) including fin-type field effect transistors (FIN-FETs), comprising:
   providing a substrate having thereon a semiconductor layer including a first portion and a second portion of substantially uniform thickness H1;
   altering an etch rate of the second portion of the semiconductor layer;
   differentially etching the second portion to a thickness H2≠H1;
   forming first semiconductor fins in the first portion and second semiconductor fins in the second portion;
   using the first and second fins, forming first and second FIN-FETs on the substrate by:
   forming sources and drains in or on the fins and adapted to communicate with conductive channels induceable in the fins;
   forming gate structures at least on opposed sides of the fins adapted to induce the conductive channels in the fins, and
   wherein the first FIN-FETs on the substrate have fin height H1 and the second FIN-FETs have fin height H2≠H1.

2. The method of claim 1, wherein altering an etch rate of the second portion of the semiconductor layer comprises altering an etch rate of the second semiconductor fins.

3. The method of claim 2, wherein altering an etch rate of the second semiconductor fins comprises altering an etch rate of an upper portion of the second semiconductor fins to a depth amount D~H1−H2; and wherein differentially etching the second portion to have the thickness H2≠H1 comprises differentially etching the upper portion to remove depth amount D from the second semiconductor fins to obtain the second semiconductor fins of fin height H2<H1.

4. The method of claim 1, wherein altering an etch rate of the second portion of the semiconductor layer comprises:
   applying a first mask over the first and second semiconductor fins, having an open portion exposing the second semiconductor fins and a closed portion protecting the first semiconductor fins; and
   implanting etch rate changing ions through the open portion into a portion of depth amount D of the second semiconductor fins.

5. The method of claim 4, further comprising after differentially etching, determining whether further semiconductor fins need to be shortened, and if YES, repeating applying, implanting, etching and determining to selected fins until the outcome of determining is NO.

6. The method of claim 4, wherein the semiconductor fins comprise silicon and implanting etch rate changing ions comprises implanting germanium.

7. The method of claim 6, wherein implanting comprises implanting germanium ions to a dose of at least about 1E14 ions/cm$^2$.

8. The method of claim 1, further comprising, prior to differentially etching, annealing the semiconductor layer at a temperature in the range of about 500 to 1350 degrees centigrade.

9. The method of claim 1, wherein altering an etch rate of the second portion of the semiconductor layer and differentially etching the second portion to have the thickness H2≠H1 comprises thinning the second portion of the semiconductor layer to have thickness H2; and wherein forming first semiconductor fins in the first portion and second semiconductor fins in the second portion comprises etching the semiconductor layer to obtain a group of first semiconductor fins of height H1 in the un-thinned first portion of the semiconductor layer and a group of second semiconductor fins of height H2<H1 in the thinned second portion of the semiconductor layer.

10. The method of claim 9, wherein thinning comprises:
    altering an etch rate of the second portion of the semiconductor layer to a depth amount D≠H1−H2; and
    differentially etching the second portion to have the thickness H2~H1−D.

11. The method of claim 9, wherein thinning comprises:
    applying a mask over the semiconductor layer, having an open portion exposing the second portion of the semiconductor layer and a closed portion protecting the first portion of the semiconductor layer;
    implanting etch rate changing ions through the open portion into the second portion of the semiconductor layer, thereby altering the etch rate of depth amount D2~H1−H2; and
    differentially etching to remove depth amount D2 of the second portion of the semiconductor layer to obtain second thickness H2.

12. The method of claim 11, further comprising after removing, determining whether a further portion needs to be thinned, and if YES, repeating applying, implanting, differentially etching and determining until the outcome of determining is NO.

13. The method of claim 11, wherein the semiconductor layer comprises silicon and implanting etch rate changing ions comprises implanting germanium.

14. The method of claim 11, wherein implanting comprises implanting germanium ions to a dose of at least about 1E15 ions/cm$^2$.

15. A method for making an integrated circuit (IC) having fin-type field effect transistors, hereafter FIN-FETs, embodying semiconductor fins, comprising:
    providing a substrate;
    forming on a first surface of the substrate a semiconductor layer;

providing an etch mask on the semiconductor layer, having one or more closed portions corresponding to the desired locations of the semiconductor fins and open portions elsewhere;

etching the semiconductor layer through the open portions of the mask, thereby forming semiconductor fins of height H on the substrate underlying the closed portions of the mask;

covering the semiconductor fins with an implant mask having an open portion in which some of the semiconductor fins are exposed and a closed portion protecting other semiconductor fins;

implanting etch rate altering ions to a depth amount D into upper portions of the semiconductor fins exposed in the open portions of the implant mask; and removing substantially the upper portions of depth amount D from the some of the semiconductor fins to reduce their height on the substrate to $Hj<H$.

16. The method of claim 15, further comprising before the removing step, annealing the upper portions at temperatures in the range of about 500 to 1350 degrees centigrade.

17. The method of claim 15, wherein the semiconductor layer is substantially silicon and the etch rate altering ions comprise germanium.

* * * * *